(12) United States Patent
Zou

(10) Patent No.: US 11,335,223 B2
(45) Date of Patent: May 17, 2022

(54) DISPLAY PANEL AND DISPLAY DEVICE

(71) Applicant: WUHAN CHINA STAR OPTOELECTRONICS TECHNOLOGY CO., LTD., Hubei (CN)

(72) Inventor: Gonghua Zou, Wuhan (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 216 days.

(21) Appl. No.: 16/615,952

(22) PCT Filed: May 22, 2019

(86) PCT No.: PCT/CN2019/087960
§ 371 (c)(1),
(2) Date: Nov. 22, 2019

(87) PCT Pub. No.: WO2020/211147
PCT Pub. Date: Oct. 22, 2020

(65) Prior Publication Data
US 2021/0335163 A1    Oct. 28, 2021

(30) Foreign Application Priority Data
Apr. 15, 2019  (CN) .......... 201910300797.X

(51) Int. Cl.
*G09G 3/00* (2006.01)
*H05K 1/02* (2006.01)
*H05K 1/11* (2006.01)

(52) U.S. Cl.
CPC .......... *G09G 3/006* (2013.01); *H05K 1/0259* (2013.01); *H05K 1/118* (2013.01); *H05K 2201/10128* (2013.01)

(58) Field of Classification Search
CPC ...... G09G 3/006; G09G 3/3648; G02B 5/201; G06F 3/044; H05K 1/0259; H05K 1/118; H02J 9/061; H02H 9/044; H02H 9/046
See application file for complete search history.

(56) References Cited

U.S. PATENT DOCUMENTS

| | | | | |
|---|---|---|---|---|
| 9,939,696 | B2* | 4/2018 | Nakanishi | G09F 9/30 |
| 9,966,000 | B2* | 5/2018 | Fan | H01L 25/167 |
| 10,101,621 | B2* | 10/2018 | Hu | H01L 27/124 |
| 10,949,016 | B2* | 3/2021 | Teranishi | G06F 3/0445 |
| 2006/0266544 | A1* | 11/2006 | Tung | H05K 9/0067 174/250 |
| 2012/0092361 | A1* | 4/2012 | Saitoh | G02B 5/201 345/589 |
| 2013/0182359 | A1* | 7/2013 | Jeon | H02H 9/044 361/56 |

(Continued)

*Primary Examiner* — Fred Tzeng

(57) ABSTRACT

A display panel and a display device are provided. The display panel includes a driving chip and an electrostatic protection module including a plurality of adjustment units. The adjustment units correspond to at least a part of connection lines, and the electrostatic protection module is configured to adjust a current value on the connection lines when an absolute value of an actual voltage on the connection lines is greater than a preset voltage to prevent damage to the connection lines.

18 Claims, 3 Drawing Sheets

(56) References Cited

U.S. PATENT DOCUMENTS

| | | | |
|---|---|---|---|
| 2013/0201584 A1* | 8/2013 | He | H02H 9/046 361/56 |
| 2014/0035868 A1* | 2/2014 | Yasue | G06F 3/044 345/174 |
| 2014/0180274 A1* | 6/2014 | Kabaya | A61B 18/1445 606/34 |
| 2015/0027370 A1* | 1/2015 | Okamoto | H01B 13/0033 118/712 |
| 2015/0255449 A1* | 9/2015 | Kim | G09G 3/3648 349/40 |
| 2018/0175606 A1* | 6/2018 | Giacomini | H02J 9/061 |

* cited by examiner

DISPLAY PANEL AND DISPLAY DEVICE

CROSS-REFERENCE TO RELATED APPLICATIONS

This application is a 371 U.S. National Stage of International Application No. PCT/CN2019/087960, filed on May 22, 2019, which claims priority to Chinese Application No. 201910300797.X, filed on Apr. 15, 2019. The entire disclosures of the above applications are incorporated herein by reference.

FIELD OF INVENTION

The present disclosure relates to the field of display technologies, and more particularly to a display panel and a display device.

BACKGROUND OF INVENTION

With the development of full screens, in order to increase a screen ratio, there is a need to reduce a width of a lower frame of a display panel. As illustrated in FIG. 1, a current chip on glass (COG) module includes a substrate 10, a display area 11, a driving chip 20 positioned below the display area 11, and a flexible circuit board (FPC) 30. A size of the lower frame of the display panel is composed of a width a of an FPC binding area, a width b between the driving chip and the FPC (a width of a wire on array (WOA) area), a width c of the driving chip 20, and a width d of a fan-out line of a data line.

However, a frame size of such a display panel structure is relatively large, and then the structure illustrated in FIG. 2 is provided. A size of a lower frame of a display panel in FIG. 2 is mainly composed of the width d of the fan-out line of the data line and the width c of the driving chip 20. Referring to FIG. 3, an output terminal 31 of the flexible circuit board 30 is connected to a plurality of pins 21 of the driving chip 20 by a connection line 32. Although this structure reduces the width of the lower frame, a length of the connection line (WOA trace) 32 is long, resulting in a large impedance of the connection line, which makes the connection line susceptible to electrostatic discharge (ESD) breakdown. Therefore, a signal source cannot be input to the display panel normally, and the display panel cannot be displayed normally.

Therefore, there is a need to provide a display panel and a display device to solve issues of the prior art.

SUMMARY OF INVENTION

An object of the present disclosure is to provide a display panel and a display device capable of preventing an electrostatic discharge (ESD) breakdown of connection lines and enabling the display panel to be normally displayed.

To solve the above technical problem, an embodiment of the present disclosure provides a display panel. The display panel includes a driving chip, a flexible circuit board connected to the driving chip and a circuit board, and an electrostatic protection module including a plurality of adjustment units. The flexible circuit board includes a plurality of output terminals disposed on opposite sides of the driving chip, and the output terminals are connected to a plurality of pins of the driving chip by a plurality of connection lines. The adjustment units correspond to at least a part of the connection lines, each of the at least part of the connection lines is connected to each of the adjustment units, and the electrostatic protection module is configured to adjust a current value on the connection lines when an absolute value of an actual voltage on the connection lines is greater than a preset voltage to prevent damage to the connection lines.

An embodiment of the present disclosure also provides a display device including the above display panel.

The display panel and display device of the embodiment of the present disclosure include a driving chip, a flexible circuit board, and an electrostatic protection module. The flexible circuit board includes a plurality of output terminals disposed on opposite sides of the driving chip, and the output terminals are connected to a plurality of pins of the driving chip by a plurality of connection lines. The adjustment units correspond to at least a part of the connection lines, each of the at least part of the connection lines is connected to each of the adjustment units, and the electrostatic protection module is configured to adjust a current value on the connection lines when an absolute value of an actual voltage on the connection lines is greater than a preset voltage to prevent damage to the connection lines. Because the electrostatic protection module is added, an electrostatic discharge (ESD) breakdown of the connection lines is effectively prevented, so that a signal source can be normally input to the display panel, and the display panel is normally displayed.

DETAILED DESCRIPTION OF PREFERRED EMBODIMENTS

Figure 1:
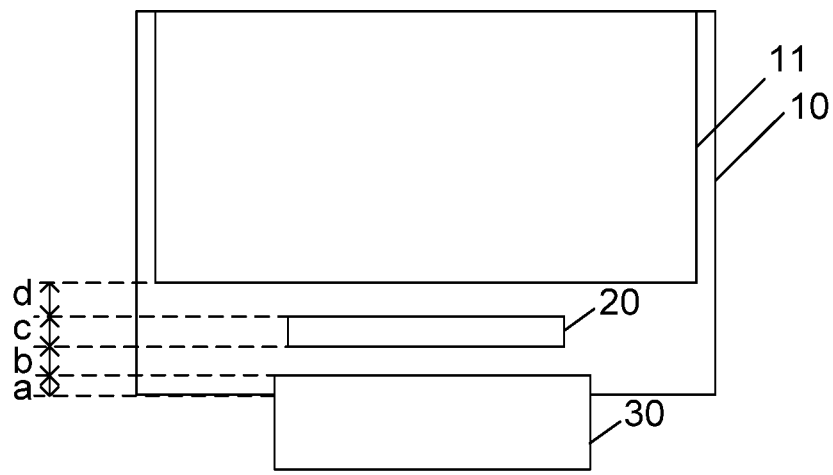
FIG. 1 is a first schematic structural diagram of a current display panel.
Figure 2:
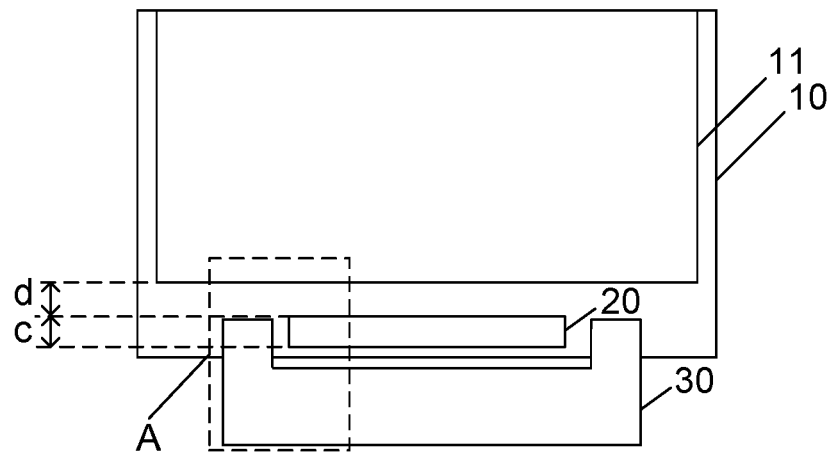
FIG. 2 is a second schematic structural diagram of a current display panel.
Figure 3:
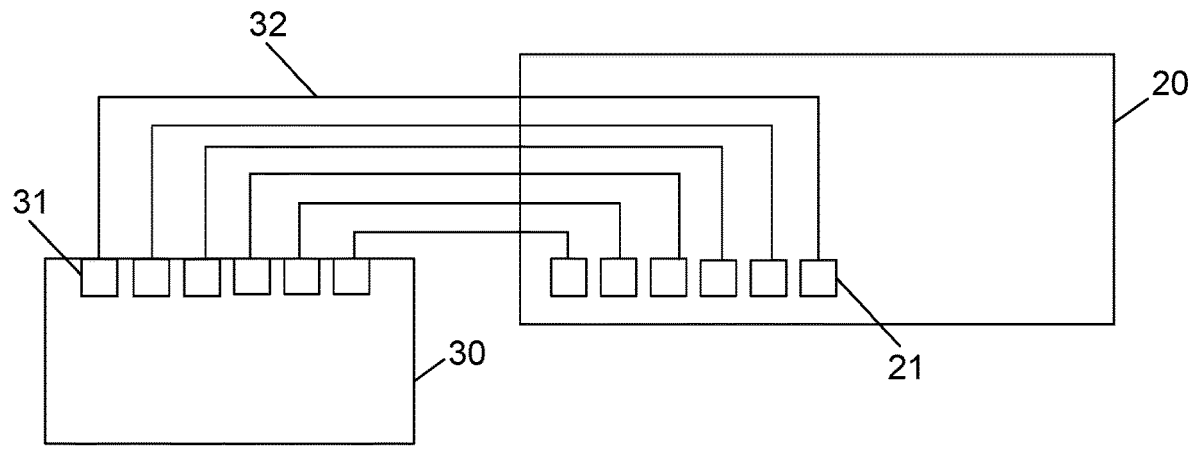
FIG. 3 is an enlarged view of an area A in FIG. 2.

The following description of the various embodiments is provided to illustrate the specific embodiments with reference to the accompanying drawings. Directional terms described by the present disclosure, such as top, bottom, front, back, left, right, inner, outer, side, etc., are only directions by referring to the accompanying drawings. Therefore, the directional terms used are for the purpose of illustration and understanding of the present disclosure and are not intended to be limiting of the present disclosure. In the drawings, units with similar structures are labeled with the same reference number.

Referring to FIGS. 4 to 8, and FIG. 4 is a schematic structural diagram of a display panel according to an embodiment of the present disclosure.

Figure 4:
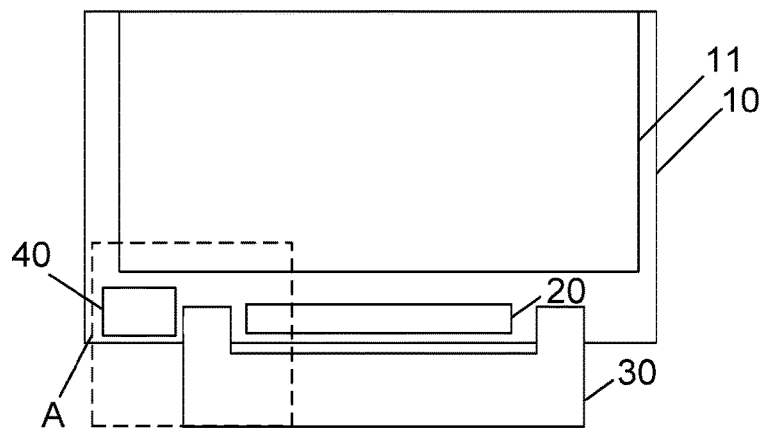
FIG. 4 is a schematic structural diagram of a display panel according to an embodiment of the present disclosure.
Figure 5:
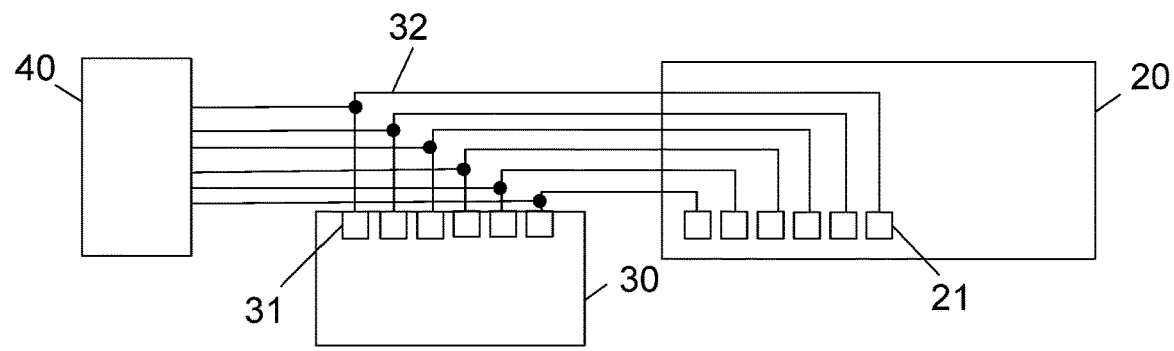
FIG. 5 is a first enlarged view of an area A of FIG. 4 according to an embodiment of the present disclosure.

As illustrated in FIGS. 4 and 5, an embodiment of the present disclosure further provides a display panel including a display area 11 and a binding area (not shown). The binding area is positioned below the display area 11. The display area 11 includes a plurality of data lines and a plurality of scan lines. The display panel includes a driving chip 20, a circuit board (not shown), a flexible circuit board 30, and an electrostatic protection module 40. The display panel may further include a substrate 10. The driving chip 20, and the flexible circuit board (FPC) 30 are both disposed on the substrate 10.

The driving chip 20 is electrically connected to the display area 11. For example, the driver chip 20 is connected to the data lines of the display area 11. The driver chip 20 includes a plurality of pins 21.

As illustrated in FIGS. 4 and 5, the flexible circuit board 30 of the embodiment of the present disclosure is used to connect the driving chip 20 and the circuit board. The flexible circuit board 30 includes a plurality of output terminals 31, and the output terminals 31 correspond to a plurality of connection lines 32. The pins 21 correspond to the output terminals 31.

Referring to FIG. 5, the output terminals 31 are connected to the driving chip 20 by the connection lines 32. For example, the output terminals 31 in an area A is connected to the driving chip 20 by six connection lines 32.

As illustrated in FIG. 5, the electrostatic protection module 40 is connected to the connection lines 32. The electrostatic protection module 40 is configured to adjust a current value on the connection lines 32 when an absolute value of an actual voltage on the connection lines 32 is greater than a preset voltage to prevent damage to the connection lines 32. The electrostatic protection module 40 is connected to the connection lines 32 close to a side of the output terminals 31. That is, the electrostatic protection module 40 is connected to the connection lines 32 close to the side of the output terminals 31, and current on the connection lines 32 is adjusted in time to prevent electrostatic discharge breakdown of the connection lines, thereby better protecting the connection lines. The electrostatic protection module 40 is positioned at an edge of the binding area and is positioned outside the flexible circuit board 30.

Figure 6:
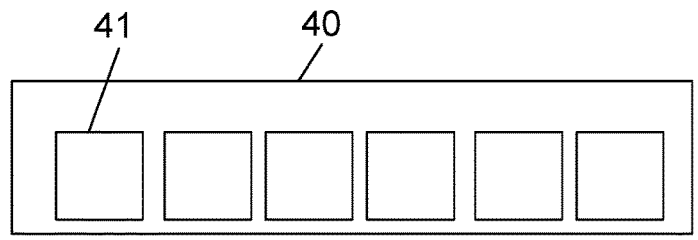
FIG. 6 is a schematic structural diagram of an electrostatic protection module of FIG. 5.
Figure 7:
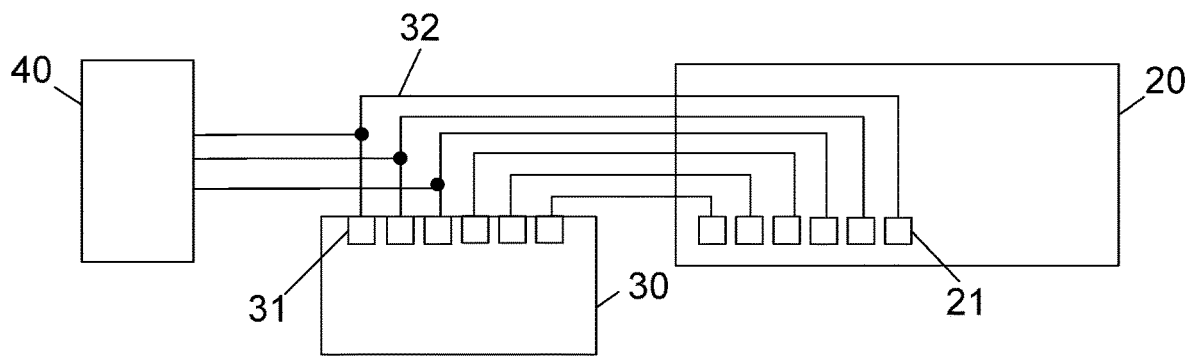
FIG. 7 is a second enlarged view of the area A of FIG. 4 according to an embodiment of the present disclosure.

In an embodiment, in order to better prevent the electrostatic discharge breakdown of the connection lines, as illustrated in FIG. 6, the electrostatic protection module 40 includes six adjustment units 41, and the adjustment unit 41 corresponds to the connection lines 32. In an embodiment, for example, all the connection lines 32 are connected to the electrostatic protection module 40, and each of the connection lines 32 corresponds to one adjustment unit 41. That is, each of the connection lines 32 is connected to each of the adjustment units 41. It is understood that, a number of the adjustment units 41 is not limited. In another embodiment, in order to simplify processes, as illustrated in FIG. 7, a part of the connection lines 32 is connected to the electrostatic protection module 40, for example, three outer connection lines are connected to the electrostatic protection module 40. Lengths of the connection lines 32 are different, and lengths of the connection lines closer to an outer side is larger. In one embodiment, setting connection lines 32 of the connection lines are connected to the electrostatic protection module 40. Each of the setting connection lines corresponds to one adjustment unit. A length of the setting connection line is greater than a preset length. For example, the three outermost connection lines in FIG. 7 are setting connection lines.

Figure 8:
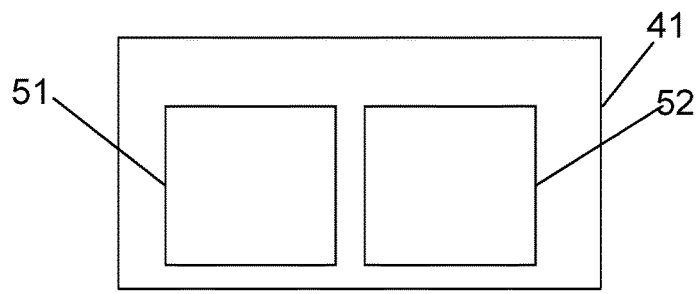
FIG. 8 is a schematic structural diagram of an electrostatic protection module according to an embodiment of the present disclosure.

As illustrated in FIG. 8, in order to further prevent the electrostatic discharge breakdown of the connection lines, the adjustment unit 41 includes a first adjustment subunit 51 and a second adjustment subunit 52. The first adjustment subunit 51 is configured to reduce the current value on the connection lines 32 when the actual voltage on the connection lines 32 is greater than a first preset voltage.

The second adjustment subunit 52 is configured to increase the current value on the connection lines 32 when the actual voltage on the connection lines 32 is less than a second preset voltage, and the first preset voltage is greater than the second preset voltage.

Figure 9:
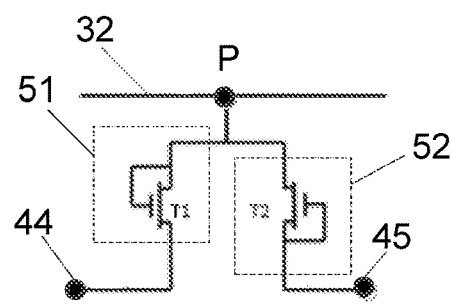
FIG. 9 is a circuit diagram of an electrostatic protection module according to an embodiment of the present disclosure.

In an embodiment, as illustrated in FIG. 9, the first adjustment subunit 51 includes a first thin film transistor T1. A gate and a source of the first thin film transistor T1 are connected to corresponding connection lines, respectively, a drain of the first thin film transistor T1 is connected to a first pull-down point 44, and the first pull-down point 44 is connected to a first preset voltage VGH. The second adjustment subunit 52 includes a second thin film transistor T2, a gate and a drain of the second thin film transistor T2 are both connected to a second pull-down point 45, and the second pull-down point 45 is connected to a second preset voltage VGH. The first thin film transistor T1 and the second thin film transistor T2 are both NPN type thin film transistors. It is understood that the first pull-down point and the second pull-down point can be access terminals of VGH and VGL, respectively. It is understood that, specific positions thereof can be set according to actual needs.

In a specific operation process, when the voltage value on the connections line 32 is greater than VGH, T1 is turned on, at this time, a part of the current on the connection lines 32 flows to the first pull-down point 44, and the remaining part flows to the connection lines 32 after a node P, thereby reducing the voltage value on the connection lines. When the voltage value on the connection lines 32 is less than VGL, T2 is turned on, at this time, a part of the current on the connection lines 32 flows to the second pull-down point 45, and the remaining part of the current flows to the connection lines 32 after the node P (finally flows into the driving chip), thereby reducing the current value on the connection lines and the voltage value on the connection lines. It is understood that the electrostatic protection module 40 of the embodiment of the present disclosure may also employ circuits of other configurations.

In order to further reduce an impedance of the connection lines, an impedance of the connection lines 32 is less than an impedance of traces in the flexible circuit board 30. In an embodiment, a cross-sectional structure of the connection lines 32 includes Mo, Al, and Mo, and material of the traces is copper.

It is understood that the electrostatic protection module positioned on a right side of the driving chip 20 is connected in the same manner as in FIG. 5 or FIG. 7, and details are not described herein again.

The electrostatic protection module is added to the display panel. When the absolute value of the actual voltage on the connection lines is greater than the preset voltage, the electrostatic protection module adjusts the current value on the connection lines to prevent excessive voltage from causing breakdown of the connection lines to avoid damaging the connection lines, so that a signal source can be normally input to the display panel, and the display panel is normally displayed.

An embodiment of the present disclosure also provides a display device including the above display panel. The display device may include a backlight module.

The display panel and display device of the embodiment of the present disclosure include a driving chip, a flexible circuit board, and an electrostatic protection module. The flexible circuit board includes a plurality of output terminals disposed on opposite sides of the driving chip, and the output terminals are connected to a plurality of pins of the driving chip by a plurality of connection lines. The adjustment units correspond to at least a part of the connection lines, each of the at least part of the connection lines is connected to each of the adjustment units, and the electrostatic protection module is configured to adjust a current value on the connection lines when an absolute value of an actual voltage on the connection lines is greater than a preset voltage to prevent damage to the connection lines. Because the electrostatic protection module is added, an electrostatic discharge (ESD) breakdown of the connection lines is effectively prevented, so that a signal source can be normally input to the display panel, and the display panel is normally displayed.

In the above, the present disclosure has been disclosed in the above preferred embodiments, but the preferred embodiments are not intended to limit the present disclosure. Various changes and modifications can be made by those skilled in the art without departing from the spirit and scope of the present disclosure. The scope of protection of the present disclosure is therefore defined by the scope of the claims.

What is claimed is:

1. A display panel, comprising:
   a driving chip;
   a flexible circuit board connected to the driving chip and a circuit board, wherein the flexible circuit board comprises a plurality of output terminals disposed on opposite sides of the driving chip, and the output terminals are connected to a plurality of pins of the driving chip by a plurality of connection lines; and
   an electrostatic protection module comprising a plurality of adjustment units, wherein the adjustment units correspond to at least a part of the connection lines, each of the at least part of the connection lines is connected to each of the adjustment units, and the electrostatic protection module is configured to adjust a current value on each of the connection lines when an absolute value of an actual voltage on each of the connection lines is greater than a preset voltage to prevent damage to the connection lines;
   wherein lengths of the connection lines are different, and lengths of the connection lines closer to an outer side are greater than lengths of the connection lines far from the outer side.

2. The display panel according to claim 1, wherein each of the connecting lines is connected to each of the adjusting units.

3. The display panel according to claim 1, wherein the adjustment units comprise a first adjustment subunit and a second adjustment subunit, the first adjustment subunit is configured to reduce the current value on each of the connection lines when the actual voltage on each of the connection lines is greater than a first preset voltage, the second adjustment subunit is configured to increase the current value on each of the connection lines when the actual voltage on each of the connection lines is less than a second preset voltage, and the first preset voltage is greater than the second preset voltage.

4. The display panel according to claim 3, wherein the first adjustment subunit comprises a first thin film transistor, a gate and a source of the first thin film transistor are connected to corresponding connection lines, respectively, a drain of the first thin film transistor is connected to a first pull-down point, and the first pull-down point is connected to the first preset voltage.

5. The display panel according to claim 4, wherein the second adjustment subunit comprises a second thin film transistor, a gate and a drain of the second thin film transistor are both connected to a second pull-down point, and the second pull-down point is connected to the second preset voltage.

6. The display panel according to claim 5, wherein the first thin film transistor and the second thin film transistor are both NPN type thin film transistors.

7. The display panel according to claim 1, wherein a main body portion of the flexible circuit board comprises the output terminals corresponding to the connection lines, and the electrostatic protection module is connected to the connection lines close to a side of the output terminals.

8. The display panel according to claim 1, wherein lengths of the connection lines are different, a setting connection line of the connection lines is connected to the electrostatic protection module, and a length of the setting connection line is greater than a preset length.

9. The display panel according to claim 1, wherein the display panel comprises a display area and a binding area, and the electrostatic protection module is positioned at an edge of the binding area and is positioned outside the flexible circuit board.

10. A display device, comprising:
    a driving chip;
    a flexible circuit board connected to the driving chip and a circuit board, wherein the flexible circuit board comprises a plurality of output terminals disposed on opposite sides of the driving chip, and the output terminals are connected to a plurality of pins of the driving chip by a plurality of connection lines; and
    an electrostatic protection module comprising a plurality of adjustment units, wherein the adjustment units correspond to at least a part of the connection lines, each of the at least part of the connection lines is connected to each of the adjustment units, and the electrostatic protection module is configured to adjust a current value on each of the connection lines when an absolute value of an actual voltage on each of the connection lines is greater than a preset voltage to prevent damage to the connection lines;
    wherein lengths of the connection lines are different, and lengths of the connection lines closer to an outer side are greater than lengths of the connection lines far from the outer side.

11. The display device according to claim 10, wherein each of the connecting lines is connected to each of the adjusting units.

12. The display device according to claim 10, wherein the adjustment units comprise a first adjustment subunit and a second adjustment subunit, the first adjustment subunit is configured to reduce the current value on each of the connection lines when the actual voltage on each of the connection lines is greater than a first preset voltage, the second adjustment subunit is configured to increase the current value each of on the connection lines when the actual voltage on each of the connection lines is less than a second preset voltage, and the first preset voltage is greater than the second preset voltage.

13. The display device according to claim 12, wherein the first adjustment subunit comprises a first thin film transistor, a gate and a source of the first thin film transistor are connected to corresponding connection lines, respectively, a drain of the first thin film transistor is connected to a first pull-down point, and the first pull-down point is connected to the first preset voltage.

14. The display device according to claim 13, wherein the second adjustment subunit comprises a second thin film transistor, a gate and a drain of the second thin film transistor are both connected to a second pull-down point, and the second pull-down point is connected to the second preset voltage.

15. The display device according to claim 14, wherein the first thin film transistor and the second thin film transistor are both NPN type thin film transistors.

16. The display device according to claim 10, wherein a main body portion of the flexible circuit board comprises the output terminals corresponding to the connection lines, and the electrostatic protection module is connected to the connection lines close to a side of the output terminals.

17. The display device according to claim 10, wherein lengths of the connection lines are different, a setting connection line of the connection lines is connected to the electrostatic protection module, and a length of the setting connection line is greater than a preset length.

18. The display device according to claim 10, wherein the display panel comprises a display area and a binding area, and the electrostatic protection module is positioned at an edge of the binding area and is positioned outside the flexible circuit board.

* * * * *